United States Patent
Malik et al.

(10) Patent No.: US 11,948,828 B2
(45) Date of Patent: Apr. 2, 2024

(54) PIN-LESS SUBSTRATE TRANSFER APPARATUS AND METHOD FOR A PROCESSING CHAMBER

(71) Applicant: Applied Materials, Inc., Santa Clara, CA (US)

(72) Inventors: Sultan Malik, Sacramento, CA (US); Srinivas D. Nemani, Sunnyvale, CA (US); Adib M. Khan, Santa Clara, CA (US); Qiwei Liang, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/744,478

(22) Filed: Jan. 16, 2020

(65) Prior Publication Data
US 2021/0225687 A1 Jul. 22, 2021

(51) Int. Cl.
*H01L 21/687* (2006.01)
*H01L 21/677* (2006.01)

(52) U.S. Cl.
CPC .. *H01L 21/68735* (2013.01); *H01L 21/67706* (2013.01); *H01L 21/67748* (2013.01); *H01L 21/68707* (2013.01); *H01L 21/68742* (2013.01)

(58) Field of Classification Search
CPC ......... H01L 21/67706; H01L 21/67748; H01L 21/68707; H01L 21/68735; H01L 21/68742
USPC .......................................... 108/57.29, 157.16
See application file for complete search history.

(56) References Cited

U.S. PATENT DOCUMENTS

| | | | | |
|---|---|---|---|---|
| 2004/0016637 A1* | 1/2004 | Yang | ...................... | A23D 7/005 |
| | | | | 204/242 |
| 2004/0209414 A1* | 10/2004 | Mok | ................. | H01L 21/67109 |
| | | | | 438/200 |
| 2007/0029227 A1* | 2/2007 | Bonora | ................ | B25J 15/0028 |
| | | | | 206/711 |
| 2008/0266532 A1* | 10/2008 | Matsuoka | ............... | G03F 7/162 |
| | | | | 355/27 |
| 2010/0199911 A1* | 8/2010 | Mizunaga | ......... | H01L 21/68707 |
| | | | | 118/69 |
| 2017/0088949 A1 | 3/2017 | Babayan et al. | | |
| 2017/0287752 A1 | 10/2017 | Godet et al. | | |
| 2018/0261480 A1 | 9/2018 | Liang et al. | | |
| 2019/0088531 A1* | 3/2019 | Sarode Vishwanath | ..................... | |
| | | | | H01L 21/67748 |
| 2019/0259647 A1* | 8/2019 | Thirunavukarasu | ........................ | |
| | | | | H01L 21/68735 |

FOREIGN PATENT DOCUMENTS

JP 2017101318 A 6/2017

* cited by examiner

*Primary Examiner* — Saul Rodriguez
*Assistant Examiner* — Brendan P Tighe
(74) *Attorney, Agent, or Firm* — Patterson + Sheridan, LLP

(57) ABSTRACT

The present disclosure generally relates to a pin-less substrate transfer apparatus and method for a processing chamber. The processing chamber includes a pedestal. The pedestal includes a pedestal plate. The pedestal plate has a radius, a top surface, and a bottom surface. The pedestal plate further includes a plurality of cut outs on a perimeter of the pedestal plate. Flat edges are disposed on opposite sides of the pedestal plate. Recesses are disposed in the bottom surface below each of the flat edges.

20 Claims, 7 Drawing Sheets

PIN-LESS SUBSTRATE TRANSFER APPARATUS AND METHOD FOR A PROCESSING CHAMBER

BACKGROUND

Field of Endeavor

Examples described herein generally relate to a pin-less substrate transfer apparatus and method for a processing chamber configured to process substrates.

DETAILED DESCRIPTION

Description of the Related Art

The field of semiconductor manufacturing utilizes various processes to fabricate devices which are incorporated into integrated circuits. As device complexity increases, integrated circuit manufacturers look for improved methodologies to fabricate advanced node devices. For example, advanced processing characteristics may include the utilization of more extreme process variables to enable advanced device fabrication.

One example of a process variable which is increasingly being investigated for utilization in semiconductor manufacturing is high pressure processing. High pressure processing, at pressures elevated above atmospheric pressure, has shown promising material modulation characteristics. Substrate process chambers may be subject to an environment that includes high temperatures above 200° C. and pressures above 1 bar.

During processing, the substrate may rest on a support structure that moves in a vertical direction. In order to move the substrate, conventional approaches have used moveable support surfaces that utilize components such as lift pins, magnets, hoop, lift drive assemblies. These internal components are exposed to high temperature and high pressure environments, especially in combination with process gases introduced to the process chamber during substrate processing. In the conventional apparatus high pressure and temperature create a harsh, corrosive environment that can degrade internal components of the process chambers. Accordingly, internal components must be replaced more frequently, reducing substrate process yields and increasing the cost of routine maintenance.

As such, there is a need for an improved apparatus and method of moving the substrate within the processing chamber that addresses the problems of the conventional approaches.

SUMMARY

Disclosed herein is a pin-less substrate transfer apparatus and method for a processing chamber configured to process substrates.

In one example, a pedestal includes a pedestal plate. The pedestal plate has a radius, a top surface, and a bottom surface. The pedestal plate further includes a plurality of cut outs on a perimeter of the pedestal plate. Flat edges are disposed on opposite sides of the pedestal plate. Recesses are disposed in the bottom surface below each of the flat edges.

In another example, a processing chamber is provided. The processing chamber includes a top wall, sidewalls, and a bottom wall, defining an internal volume. A pedestal plate is disposed within the internal volume. The pedestal plate has a radius, a top surface, and a bottom surface. A plurality of cut outs are provided on a perimeter of the pedestal plate. Flat edges are disposed on opposite sides of the pedestal plate. Recesses are provided in the bottom surface below each of the flat edges.

In yet another example, a method of processing a substrate is provided. The method includes positioning a substrate supported on a blade over a pedestal plate of a pedestal disposed within a processing chamber. The method further includes lifting the substrate from tabs positioned on the blade. The substrate is transferred from the blade to a top surface of the pedestal plate. The tabs are lowered beneath the top surface of the pedestal plate upon transferring the substrate.

BRIEF DESCRIPTION OF THE DRAWING

So that the above recited features of the present disclosure can be understood in detail, a more particular description of the disclosure, briefly summarized above, may be had by reference to examples herein, some of which are illustrated in the appended drawings. However, it is to be noted that the appended drawings illustrate only examples and are therefore not to be considered limiting of the disclosure's scope. Accordingly, the appending drawings admit to other equally effective examples.

In order to facilitate understanding, identical reference numerals have been used, where possible, to designate identical elements that are common features. It is contemplated that elements and features of one example may be beneficially incorporated into other examples without further recitation.

DETAILED DESCRIPTION

Examples disclosed herein generally relate to a pin-less substrate transfer apparatus and method for a processing chamber configured to process substrates. It should be noted however that the disclosed subject matter has utility in other system configurations such as etch systems, chemical vapor deposition systems, physical vapor deposition systems, and other systems. The pin-less substrate transfer apparatus offers benefits not present in the conventional substrate supporting devices. The apparatus simplifies processing chamber design and routing maintenance by eliminating features that are used in conventional apparatuses, such as lift pins, hoop, and lift drives assembly. In particular, the apparatuses and methods described herein eliminate the need for seats or bellows, which is a common source for seal failure or chamber leakage.

Advantageously, the pin-less substrate transfer apparatus include a thicker pedestal plate that improves temperature non-uniformity across the pedestal plate. By increasing temperature non-uniformity across the pedestal plate, temperature non-uniformity across the processed substrate is also reduced. Additionally, the apparatus and method herein also reduces inner chamber internal volume by about 1 litre, reducing the amount of processing gas needed for substrate processing. Additionally, since conventional magnetic lift pins are no longer needed, the effectiveness of substrate transfer is decoupled from temperature, which often adversely effects conventional magnetic lift systems, thus eliminating the need to serve these components while having a more robust, reliable and less temperature sensitive substrate transfer equipment.

Figure 1:
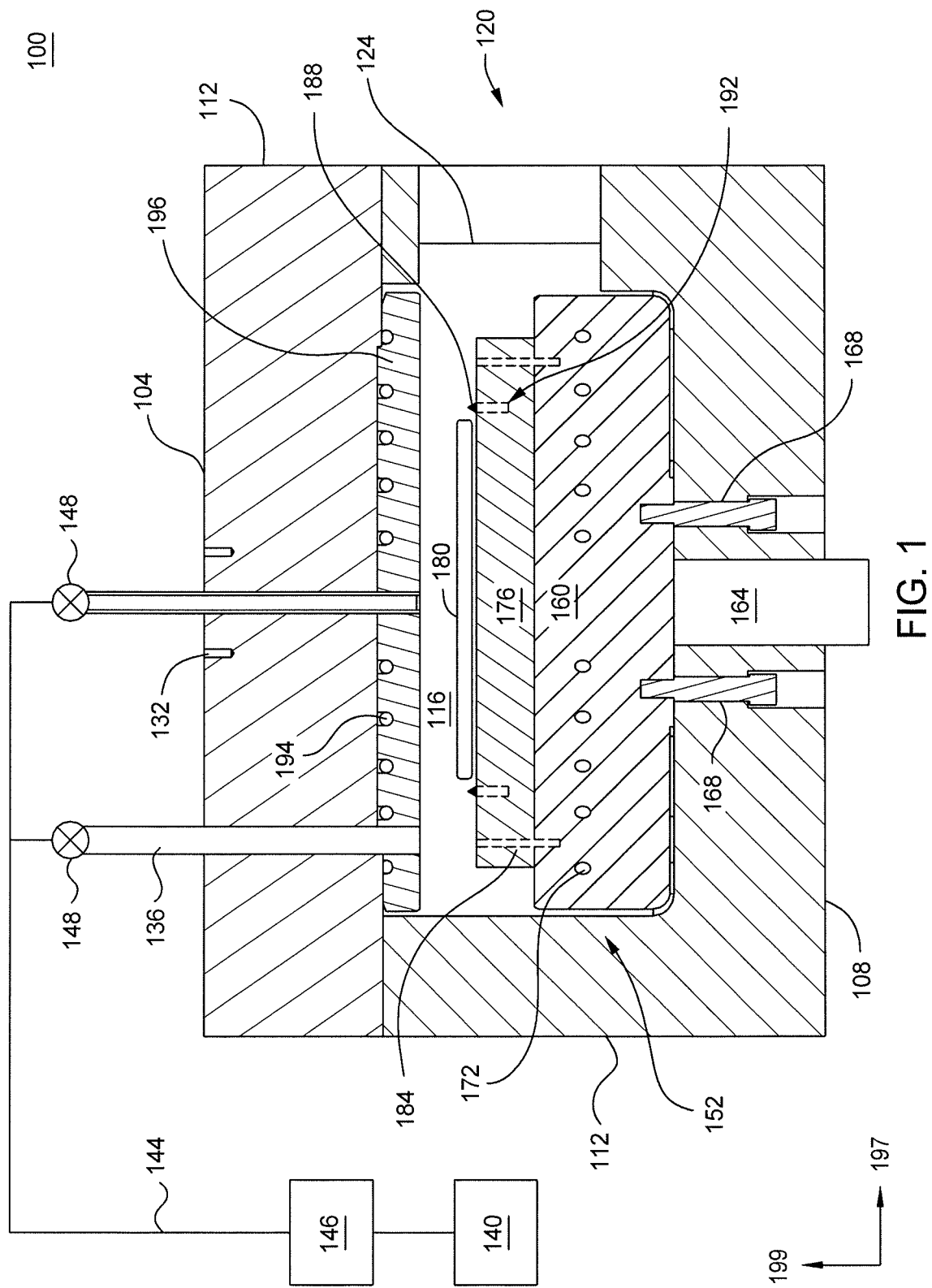
FIG. 1 is an exemplary processing chamber suitable for performing the methods disclosed herein.

FIG. 1 is an exemplary processing chamber 100 configured to process substrates without the use of conventional lift pins. The processing chamber 100 includes a top wall 104, a bottom wall 108, and at least one sidewall 112. In another example of the processing chamber 100, there may be four or more sidewall(s) 112. A space enclosed by the top wall 104, the bottom wall 108, and sidewall(s) 112 defines an internal volume 116. The processing chamber 100 may be a vacuum or high-pressure chamber. For example, in at least one example, the processing chamber 100 is capable of operating at a pressure of above 50 Barr and to perform a high-pressure process such as deposition or annealing. The processing chamber 100 is also configured to operate at pressures below about 100 milliTorr, and to perform a low-pressure process such as etching, deposition, or thermal treatment. In some examples, the low-pressure state can be a near-vacuum state, e.g., a pressure less than 1 milliTorr. In some implementations, the processing chamber 100 may be adapted to operate in a multi-chamber processing system, such as a cluster tool. One example of the cluster tool is commercially available from Applied Materials, Inc. of Santa Clara, Calif., and is known as the ENDURA® system.

An x-direction 197 and a z-direction 199 are shown in FIG. 1. A y-direction 198 (shown in FIG. 2) is orthogonal to a plane that includes the x-direction 197 and z-direction. The z-direction 199 is orthogonal to a plane that includes the x-direction 197 and y-direction 198. Accordingly, the x-direction 197 is orthogonal to a plane that includes the y-direction 198 and the z-direction 199.

An opening 120, provided in the sidewall 112 of the processing chamber 100, enables substrate(s) 180 to be transferred into and out of to the internal volume 116. A door 124 opens or closes the opening 120, enabling access to the internal volume 116 through the opening 120. When the door 124 is closed, the internal volume 116 is sealed, enabling the internal volume 116 to be maintained at a desired pressure. A height 128 of the opening 120 is greater than about 1 inch and less than about 3.5 inches.

The processing chamber 100 has a gas inlet 132 and a gas outlet 136. The processing gas is introduced into the processing chamber 100 through the gas inlet 132. The processing gas is exhausted from the processing chamber 100 through the gas outlet 136. A gas delivery system 146 provides processing gas(es) to the internal volume 116 through the gas inlet 132. In one configuration, a gas delivery system 146 may include an exhaust system (not shown) to exhaust process gas(es) within the processing chamber 100, thereby depressurizing the processing chamber 100.

A controller 140 is coupled to each of the gas inlet 132 and the gas outlet 136 by at least one conduit 144. A first valve 148 is positioned between the conduit 144 and the gas inlet 132. A second valve 150 is arranged between the gas outlet 136 and the conduit 144. The first valve 148 enables one or more processing gases to be provided to the internal volume 116. Processing gases are removed from the internal volume 116 by passing through the gas outlet 136 having the second valve 150. A pump (not shown) may be coupled to the conduit 144 in order to provide the processing gas to the internal volume 116. The processing gas can be removed from the internal volume 116 via the pump. The controller 140 is operably connected to the gas delivery system 146, first valve 148, and second valve 150 for controlling operations to deposit layer(s) of material on the substrate 180. In some implementations, the controller 140 may also be operably connected to other systems of the cluster tool.

A pedestal 152 is arranged within the internal volume 116. The pedestal 152 includes a body 160. The pedestal 152 is supported by the bottom wall. A conduit 164 may be disposed through the bottom wall to route utilities to the pedestal 152. Fasteners 168 secure the pedestal 152 to the bottom wall 108 of the processing chamber 100.

A first coil 172 is arranged within the body 160. The first coil 172 is a resistive heater that heats to the pedestal 152, enabling a pedestal plate 176 to achieve a desired temperature. The heated pedestal 152 heats the substrate 180.

The pedestal plate 176 is arranged on top of the pedestal 152. The substrate 180 is disposed on top of the pedestal plate 176.

Second fasteners 184 (shown by phantom lines) are utilized to secure the pedestal plate 176 to the body 160. As illustrated, second fasteners 184 pass through a top surface of the body 160, and received in a threaded hole formed in the body 160.

A pin 188 may be mounted into a blind hole 192 formed in the pedestal plate 176. The pin 188 restricts the movement of the substrate 180 disposed on the pedestal plate 176 in a radial direction. In one example, the pin 188 may extend a distance beyond the pedestal plate 176 that is greater than the vertical thickness of the substrate 180. In another example, the pin 188 may project from the pedestal plate 176 a distance that is equal to are less than a thickness of the substrate 180. In yet another example, the pin 188 may have a height lower than the height of the substrate 180.

A ceiling plate 196 can be disposed within the internal volume 116 of the processing chamber 100. In the example shown, the ceiling plate 196 is attached to a bottom of the top wall 104. The ceiling plate 196 is positioned above the pedestal 152.

A second coil 194 is disposed within the ceiling plate 196. The second coil 194 is configured to apply heat to the substrate 180. The heat from the second coil 194 can be sufficient to anneal substrate 180 when substrate 180 is supported on the pedestal 152 and the processing gas has been introduced into the internal volume 116. In one configuration, the first coil 172 and the second coil 194 may be a resistive heating element, or a plurality of resistive heating elements. In another example, the first coil 172 or second coil 194 can be another type of heater. In one example, the substrate 180 is held by the pedestal 152 in close proximity to ceiling plate 196 in order to improve transmission of heat from second coil 194 to the substrate 180.

It is understood, that the first coil 172 and the second coil 194, or other heating coil, may be disposed in other locations within the processing chamber 100. For example, either of the first coil 172 or second coil 194 may be positioned in the sidewall 112. A power source (not shown) is coupled to the first coil 172 and the second coil 194. The power source is connected to the controller 140 to control the heat generated by the coils 172, 194, and ultimately, the temperature of the substrate 180.

Figure 2:
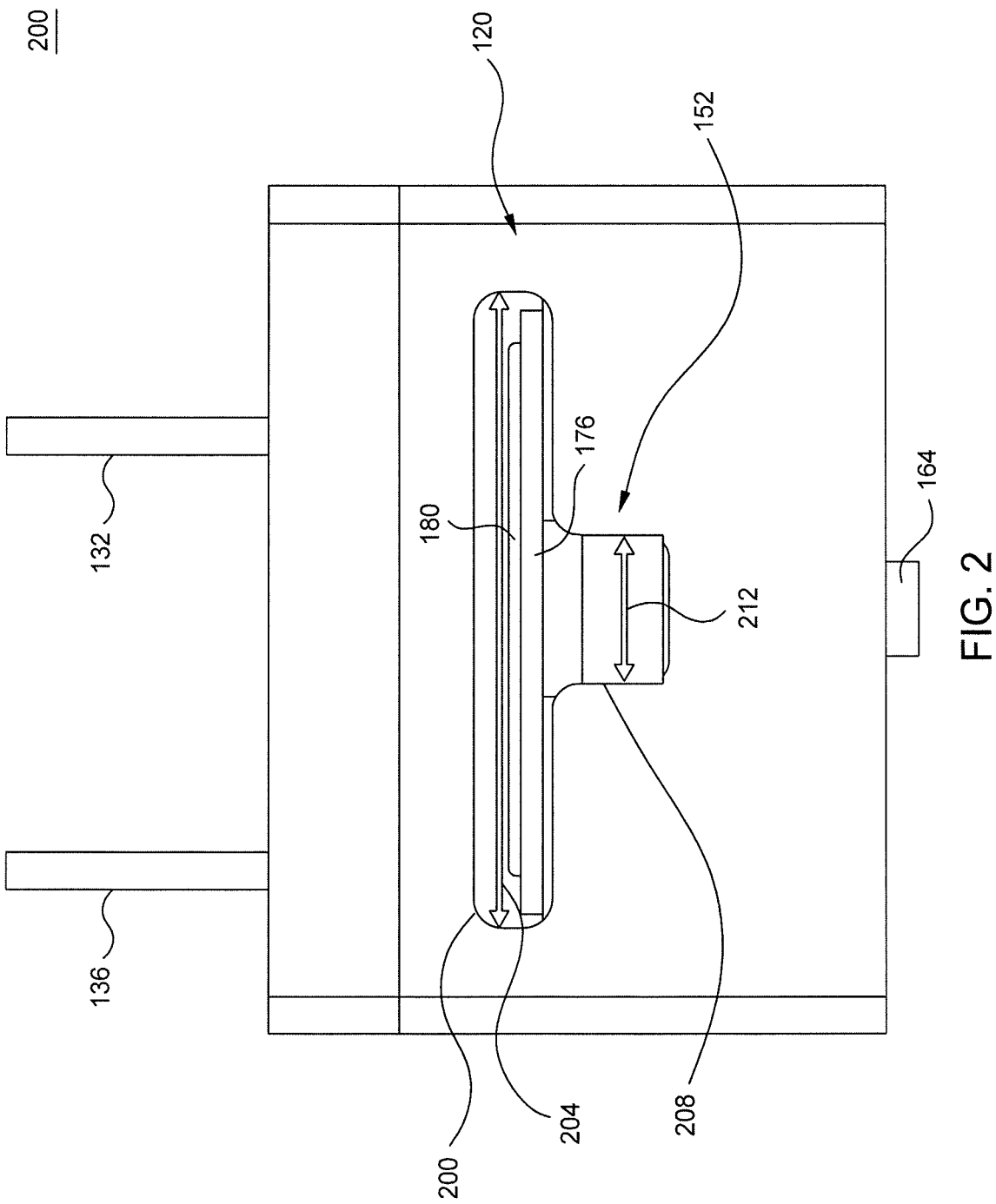
FIG. 2 is a side view of an opening of the processing chamber, illustrated in FIG. 1.

FIG. 2 is a side view of an opening of the processing chamber 100, illustrated in FIG. 1. In one example, the opening 120 includes an upper portion 200 that has a first width 204. The opening 120 has a lower portion 208 that has a second width 212. The first width 204 is greater than the second width 212. The first width 204 is sized to allow the substrate 180 to pass therethrough. For example, the first width 204 may be greater than 200 mm. In another example, the first width 204 may be greater than 300 mm. The first width 204 is above the lower portion 208. The lower portion 208 is centered below the first width 204, thus making the opening 120 "T-shaped. The lower portion 208 may also have a height that is greater than the height of the opening 200. In an alternate configuration, the second width 212 and the first width 204 are substantially equal. In the alternate configuration, the opening 120 is substantially in the shape of a rectangle.

Figure 3:
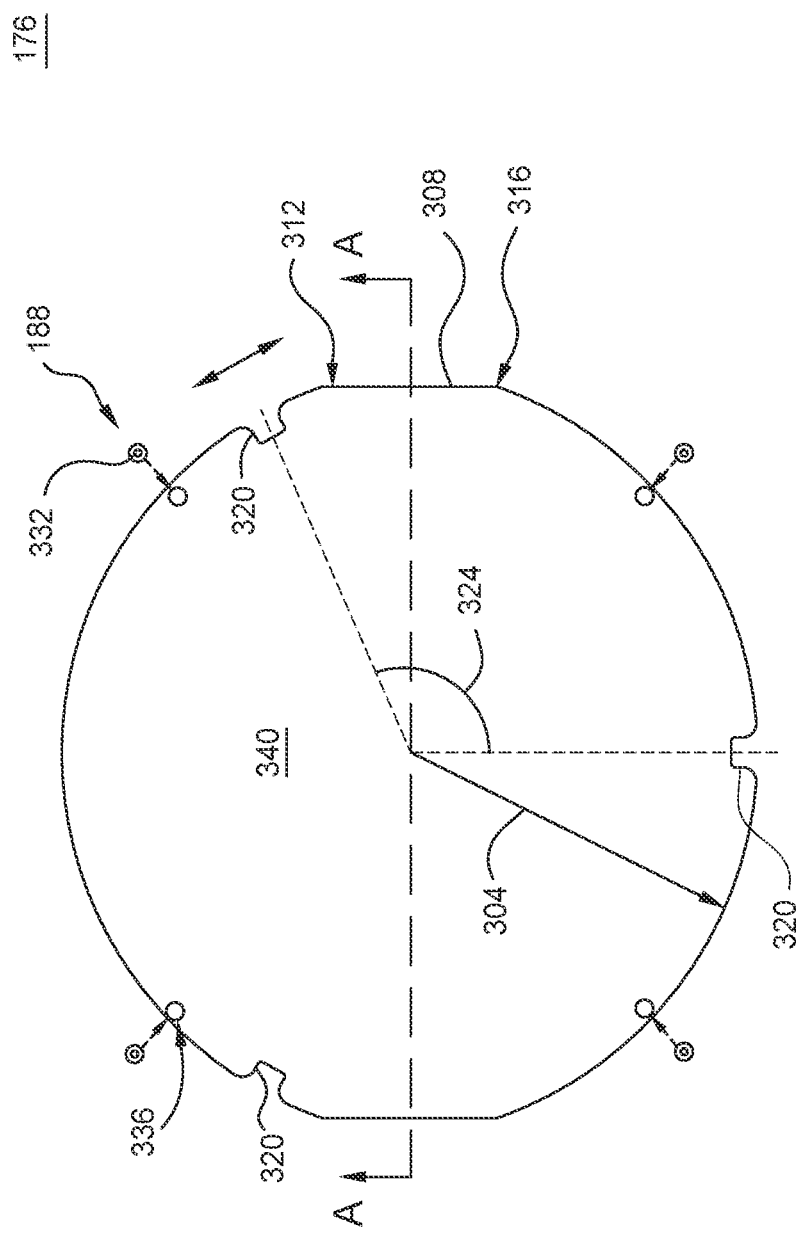
FIG. 3 is one example of the pedestal plate positioned on a top surface of the pedestal, illustrated in the processing chamber of FIG. 1.

FIG. 3 is one example of the pedestal plate 176 positioned on a top surface of the pedestal 152, illustrated in the processing chamber 100 of FIG. 1. The pedestal plate 176 has a radius 304. The radius 304 may be from about 130 mm to about 160 mm. The radius 304 may alternatively be larger or smaller. A circumference of the pedestal plate 176 includes sections having continuous radial arcs, defined by radius 304, first edge(s) 308, and cut out(s) 320.

The edge 308 is formed on the circumference of the pedestal plate 176. A first corner 312 and a second corner 316 define a length of the edge 308. FIG. 3 illustrates two edge(s) 308. Another edge 308 is formed substantially parallel to the first edge 308 on an opposite side of the pedestal plate 176 as the second edge 308.

The cut outs 320 are formed on the circumference of the pedestal plate 176. In the configuration of the pedestal plate 176 shown in FIG. 3 and FIG. 4, three cut outs 320 are shown. In another configuration, the pedestal plate 176 may have more than three cut outs 320 that are separated by one of the edges 308. The first corner 312 of the edge 308 is closer to one of the cut out(s) 320 than the first corner 312 is to the second corner 318 of the same edge 308. A first angle 324 is formed between adjacent cut out(s) 320. The first angle 324 is between about 90 degrees and about 125 degrees apart. For example, the first angle 324 may be greater than about 105 degrees and less than about 125 degrees. Each cut out 320 has a depth of about 1 inch to about 0.25 inches. In at least one example, the cut out 320 is about 0.5 inches.

The pin 188 is shown exploded from the pedestal plate in FIG. 3. The pin 188 is mounted in a hole 336 formed in the pedestal plate 176. The pin 188 has a through-hole 322 that extends axially through the pin 188. The through-hole 332 enables gas trapped in the hole 336 to escape through the pin 188, when the pressure in the processing chamber 100 is reduced. The pin 188 is configured to pass through a hole 336 in the pedestal plate 176. The pins 188 are positioned along a common radius 304. As illustrated, each hole 336 is spaced substantially equidistant from an adjacent hole 336.

The pin 188 projects out of the hole 336, so that a portion of the pin 188 remains above a top surface of the pedestal plate 176. Accordingly, when a projecting portion of the pin 188 restrains a lateral movement of the substrate 180 when disposed on the pedestal plate 176.

A material of the pedestal plate 176 has a thermal conductivity between about 120 W/mK and about 1,500 W/mK. In one example, the thermal conductivity of the pedestal plate 176 is about 130 W/mK. In another example, the thermal conductivity of the pedestal plate 176 is about 170 W/mK. The pedestal plate 176 may be fabricated from SiC, such as SiC1000, Sb containing material, AlN, carbon, such as a graphite-based material, and Si containing material, among others.

Figure 3A:
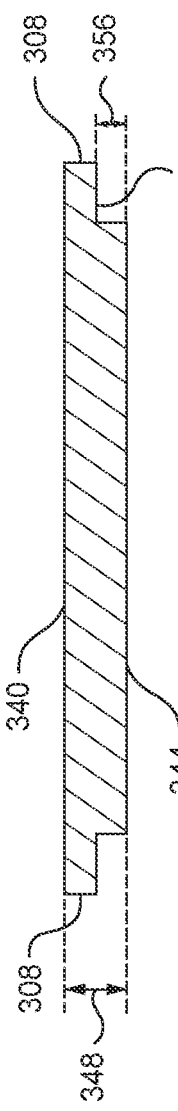
FIG. 3A is a cross-section view of the pedestal plate taken along the line A-A in FIG. 3.

FIG. 3A is a cross-section view of the pedestal plate 176 taken along the line A-A in FIG. 3 that passes through both flat edges 308. A first surface 340 of the pedestal plate 176 is illustrated opposite a second surface 344. The first surface 340 defines a top of the pedestal plate 176 and is configured to receive the substrate 180. A vertical distance between the first surface 340 and the second surface 344 defines a first height 348. A recess 352 is formed in the second surface 344 of the pedestal plate 176 along the edges 308. The vertical surfaces of the recesses are parallel to with the edges 308. A second height 356 is defined by a distance between the second surface 344 and a top horizontal surface of the recess 352.

Figure 4:
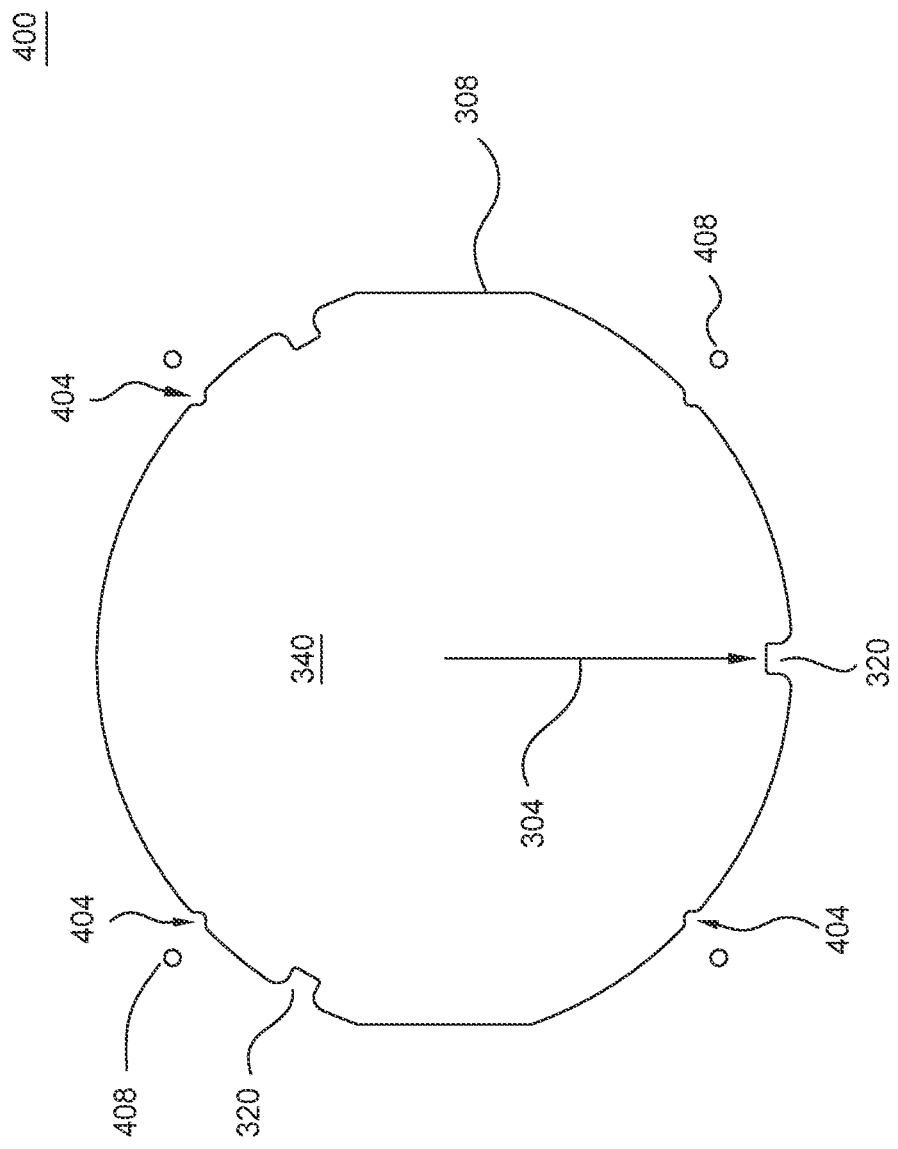
FIG. 4 is one example of another pedestal plate positioned on the top surface of the pedestal disposed in the processing chamber of FIG. 1.

FIG. 4 is one example of another pedestal plate 176 positioned on the top surface of the pedestal 152 disposed in the processing chamber 100 of FIG. 1. The features of the pedestal plate 400 are substantially the same as the pedestal plate 176, except that pins 408 are disposed in notches formed on the perimeter of the pedestal plate 176, rather than holes formed in the pedestal plate 176.

As noted above, the circumference of the pedestal plate 400 is defined by the radius 304. Each notch 404 is configured to accommodate at least a portion of a pin 408. The pin 408 abuts the notch 404 such that the substrate 180 is substantially prevented from slipping in a radial direction when on the pedestal plate 400. The notches 404 extend inward of each pin 408. The radial direction is defined by the radius 304 of the pedestal plate 176. The pin 408 is disposed in a hole formed in the body 160. The pin 408 is long enough to restrain lateral movement of the substrate 180 to the pedestal plate 400.

Figure 5:
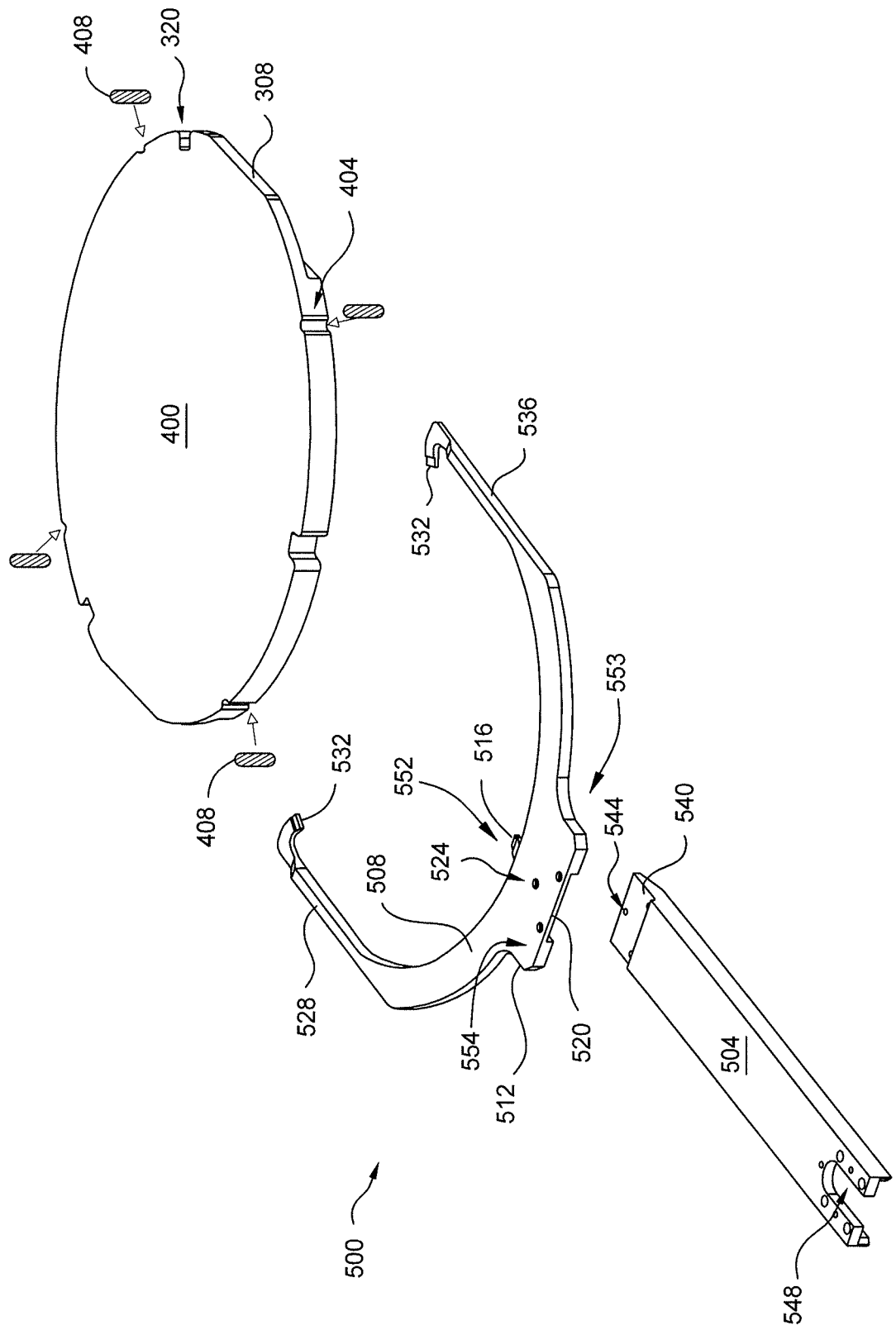
FIG. 5 is an exemplary blade configured for positioning the substrate inside the processing chamber of FIG. 1.

FIG. 5 is an exploded structural view of an exemplary blade 500 configured for positioning the substrate 180 inside the processing chamber 100 of FIG. 1. The blade 500 is shown adjacent to the pedestal plate 400, but the blade 500 may also be utilized with the pedestal plate 176. The blade 500 includes an arm 504 and a holder 508. The blade 500 is moveable in the x-direction 197, y-direction 198, and z-direction 199 by a robot, not shown.

The holder 508 includes a base 512. The base 512 has a generally U-shape. A first tab 516 protrudes from an inner surface 522 of the base 512. A coupling section 520 is formed on a bottom surface 553 of the base 512. The coupling section 520 is recessed into the bottom surface of the base 512. First through holes 524 pass through an upper side 554 of the base 512 through the base 512 to a top surface (unnumbered) of the coupling section 520.

The base 512 includes a first fork 528 and a second fork 536 that form the U-shape. The first fork 528 has a second tab 532 that extends outwardly from the base 512 across the opening of the U-shape toward the second fork 536. The second fork 536 is substantially parallel to the first fork 528. The second fork 536 has a second tab 532 extends from the base 512 across the opening of the U-shape toward the first fork 528. The first fork 528 and the second fork 536 are generally symmetrical about an imaginary line bifurcating the holder 512 and passing through the first tab 516.

The arm 504 of the blade 500 includes a terminal portion 540 at one end of the arm 504. Second through holes 544 extend through a surface of a linking segment 548 of the terminal portion 540. The linking segment 548 is recessed with respect to the top surface of the arm 504. The first through holes 524 in the base 512 of the blade 500 are configured to align with second through holes 544 in the linking segment 548 of arm 504. Fasteners (not shown) are configure to pass through the first through holes 524 and the second through holes 544 in order to secure the arm 504 to the holder 508 of the blade 500. In another example, the blade 500 may be continuous, such that the arm 504 and holder 508 are formed from a single mass of material.

The blade 500 may be formed from a material having an elastic modulus (i.e. Young's Modulus, E) from about 9000 ksi to about 35,000 ksi. More specifically, either one or both of the arm 504 and the holder 508 may be made of the material having the elastic modulus discussed herein. In one example, the E is 10,000 ksi. In another example, the EM is about 17,000 ksi. In another example, the E is about 30,000 ksi. The material may include, but is not limited to, ceramics, aluminum, titanium, and steel.

Figure 6A:
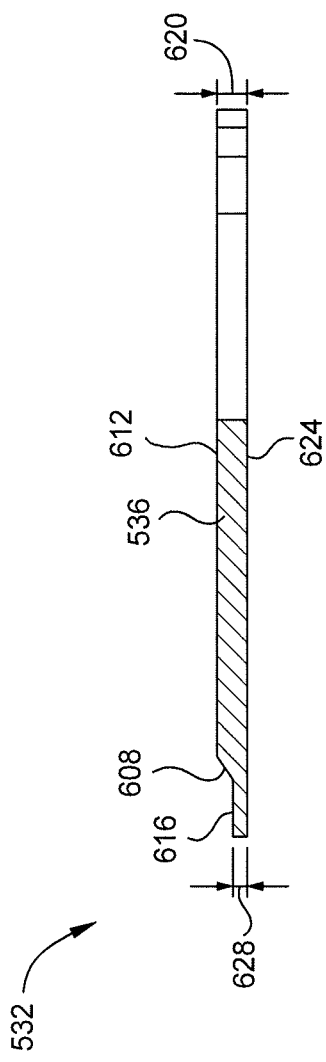
FIG. 6A is a cross-sectional plan view of the second fork of the holder, illustrated in FIG. 5, taken along line A-A.
Figure 6B:
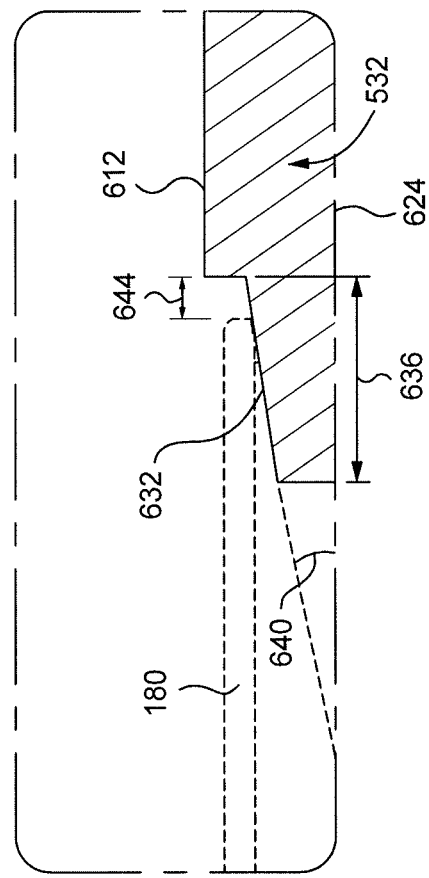
FIG. 6B is a cross-sectional plan view of the first tab of the holder, illustrated in FIG. 5, taken along line B-B.
Figure 6:
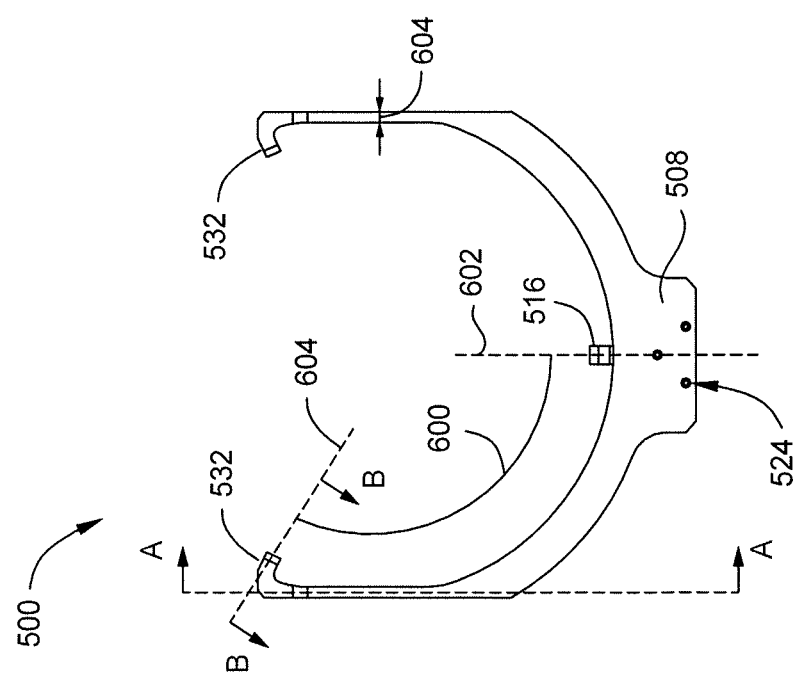
FIG. 6 is a plan view of the holder of the blade, illustrated in FIG. 5.

FIG. 6 is a plan view of the holder 508 of the blade 500, illustrated in FIG. 5. An angle 600 is formed between a center line 601 passing through the first tab 516 and a center line 603 passing through the second tabs 532. The angle 600 is greater than about 90 degrees and less than about 135 degrees. In at least one example, the angle 600 is between about 105 degrees and about 120 degrees. As discussed above, the first tab 516 is oriented and bifurcated by a centerline 601 of the holder 508. Thus, the centerline 601 is also the center line of the first tab 516. The angle 600 between the first tab 516 and the second tab 532 is selected to account for the weight of the substrate 180 weight distributed between the first tab 516 and the second tabs 532, so that the substrate 180 may be safely transported by the blade 500. A thickness 604 of either first fork 528 is less than about 0.5 inches. An exemplary thickness may less than 0.3 inches in greater than 0.2 inches.

FIG. 6A is a partial cross-sectional plan view of the second fork 536 of the holder 508, taken along line A-A of FIG. 5.

A sloped surface 608 is formed between a top surface 612 and a lower surface 616 of the second fork 536. The sloped surface 608 may have a slope of up to 90 degrees. The lower surface 616 is recessed from the top surface 612 in a vertical direction.

A first thickness 620 is defined between the top surface 612 and the bottom surface 624. A second thickness 628 is defined between the bottom surface 624 and the lower surface 616. The first thickness 620 may be between about 0.4 inches and about 0.25 inches. The second thickness 628 may be within a range from about greater than or equal to about 0.1 inches and less than about 0.25 inches. In an example, the first thickness 620 is about 0.3 inches. In another example, the second height is about 0.1 inches.

FIG. 6B is a cross-sectional plan view of the first tab 516 of the holder 508, taken along line B-B of FIG. 5.

The first tab 516 includes a mounting surface 632 is recessed from the top surface 612 of the second tab 532. The mounting surface 632 extends outward from the top surface 612 for a length 636. The mounting surface 632 is sloped from the bottom surface 624 towards the top surface 612 at an angle 640. The length 636 of the second tab 532 is selected such that a gap 644 is present when the substrate 180 is supported by the second tab 532. The gap 644 is defined between the substrate 180 and the interface between the mounting surface 632 and the top surface 612.

Figure 7:
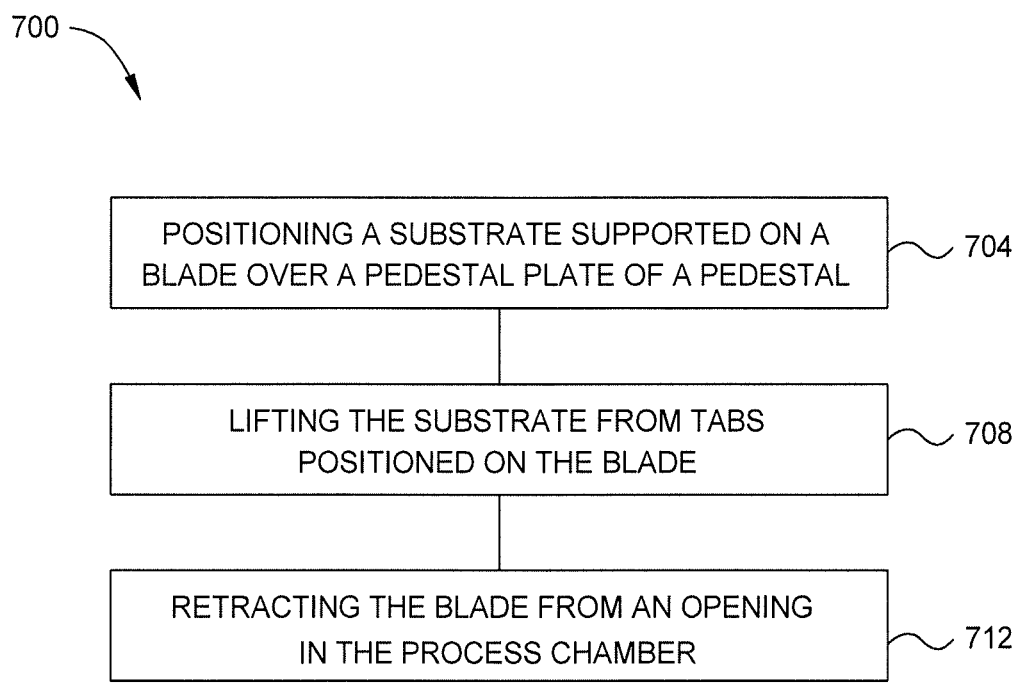
FIG. 7 is a flow chart of an exemplary method of positioning the substrate inside the processing chamber, illustrated in FIG. 1.

FIG. 7 is a flow chart of an exemplary method 700 of positioning the substrate 180 inside the processing chamber 100, illustrated in FIG. 1.

The method 700 beings at operation 704 by positioning a substrate 180 supported on a robot blade 500 over a pedestal plate 176 of a pedestal 152. The blade 500 is positioned over the pedestal plate 176 such that the first tab 516 and the second tabs 532 of the holder align with the notches in the pedestal plate 176. The substrate 180 is released from the blade 500 by lowering the blade in the z-direction 199, below a top surface (i.e. first surface 340) of the pedestal plate 176. As detailed above, the pedestal plate 176 includes a plurality of cut outs 320 that enable a portion of the blade 500 to move from the top surface of the pedestal plate 176 to the bottom surface of the pedestal plate 176. The substrate 180 may be lowered to the pedestal plate 176, or removed from the internal volume 116.

At operation 708, the blade 500 is lowered such that the first tab 516 and the second tabs 532 pass through the notches 404. As the first tab 516 and the second tabs 532 pass through the notches 404, the substrate 180 is lifted from the tabs 516, 532 by the top surface of the pedestal plate 176 effectively transferring the substrate from the blade to the pedestal plate 176. As the blade 500 is lowered, the arm 504 of the blade 500 (or the linkage of the robot coupled to the arm 504) moves from the upper portion 200 to the lower portion 208. Moving in at least the y-direction 198, the blade 500 enters the opening 120. The blade 500 may also move in the x-direction 197 and z-direction 199 when the blade 500 and substrate 180 move through the opening 200. The blade 500 may be moved in the x-direction 197, y-direction 198, as the substrate 180 is positioned above the surface of the pedestal plate 176.

At operation 712, the blade 500 is retracted out of the opening 120. While the blade 500 is being retracted, the tabs of the blade move through the recess 352 while being overlapped below with the edge 308. While moving the tabs 516 and 532 of the blade 500 move through the recess 352, the arm 504 of the blade (or the linkage of the robot coupled to the arm 504) moves through lower portion 208. Once the tabs 516 and 532 of the blade 500 are clear of the pedestal plate 176, the arm 504 of the blade 500 (or the linkage of the robot coupled to the arm 504) moves from the lower portion 208 to upper portion 200 so the blade 500 exits the processing chamber 100 through upper portion 200 of the opening 120. The blade 500 may be removed from the processing chamber 100 by lowering the blade 500 in the z-direction 199, beneath the surface of the pedestal plate 176. In another example, the blade 500 may be lowered beneath the top surface of the pedestal plate 176 without removing the blade 500 from the processing chamber 100. For example, the blade 500 can move below the top surface of the pedestal plate 176 while the blade 500 remains within the internal volume 116 of the processing chamber 100. The arm 504 of the blade 500 may move vertically within the lower portion 208 of the opening 120.

In one example, the method 700 disclosed herein may include mounting of a sensor (not shown) on any part of the arm 504 or holder 508 of the blade 500. In another configuration, the sensor is mounted on the top wall 104, bottom wall 108, or one or more sidewall(s) 112. The sensor may include but is not limited to a proximity sensor, temperature sensor, or temperature probe. The sensor facilitates mounting of the substrate 180 on the pedestal plate 176 and removal of the blade 500 from the internal volume 116. In another configuration, the sensor can monitor temperature of the blade 500, the pedestal plate 176, or the substrate 180.

Herein is disclosed a pin-less substrate transfer apparatus and method for a processing chamber. While the foregoing is directed to specific examples, other examples may be devised without departing from the basic scope thereof, and the scope thereof is determined by the claims that follow.

What we claim is:

1. A pedestal, comprising:
a pedestal plate having a radius, a top surface, and a bottom surface, the pedestal plate comprising:
a plurality of cut outs on a perimeter of the pedestal plate, wherein each cut out of the plurality of cut outs is between about 90 degrees and about 125 degrees along the perimeter away from each adjacent cut out of the plurality of cut outs on the perimeter of the pedestal plate;
flat edges disposed on opposite sides of the pedestal plate, wherein each one of the plurality of cut outs are disposed between the flat edges; and
recesses disposed in the bottom surface below each of the flat edges.

2. The pedestal of claim 1, further comprising:
a plurality of through pins extending out of the top surface of the pedestal plate, each through pin of the plurality of through pins is positioned on a common radius.

3. The pedestal of claim 2, wherein each through pin of the plurality of through pins has a coaxial through hole.

4. The pedestal of claim 1, further comprising:
a plurality of notches disposed on the pedestal plate, wherein each notch of the plurality of notches is disposed on the perimeter of the pedestal plate.

5. The pedestal of claim 4, wherein each notch extends inward of each through pin.

6. The pedestal of claim 5, wherein the plurality of notches are configured to enable a blade to pass beneath a top surface of the pedestal plate, the blade having a first tab, second tabs, and flat edges, the second tabs having a symmetrical orientation relative to an imaginary line bifurcating the first tab and the pedestal plate.

7. The pedestal of claim 1, wherein vertical surfaces of the recesses parallel to the flat edges.

8. The pedestal of claim 1, wherein each through pin is disposed in a hole formed in a body of pedestal plate.

9. The pedestal of claim 1, further comprising:
a header coupled to the pedestal plate.

10. A processing chamber, comprising:
a top wall, sidewalls, and a bottom wall, defining an internal volume;
a pedestal plate disposed within the internal volume, the pedestal plate having a radius, a top surface, and a bottom surface;
a plurality of cut outs on a perimeter of the pedestal plate, wherein each cut out of the plurality of cut outs is between about 90 degrees and about 125 degrees along the perimeter away from each adjacent cut out of the plurality of cut outs on the perimeter of the pedestal plate;
flat edges disposed on opposite sides of the pedestal plate, wherein each one of the plurality of cut outs are disposed between the flat edges; and
recesses in the bottom surface below each of the flat edges.

11. The processing chamber recited in claim 10, further comprising:
a plurality of through pins extending out of the top surface of the pedestal plate, each through pin of the plurality of through pins positioned on a common radius.

12. The processing chamber recited in claim 11, wherein each through pin of the plurality of through pins has a coaxial through hole.

13. The processing chamber recited in claim 10, further comprising:
a plurality of notches disposed on the pedestal plate, wherein each notch is disposed on the perimeter of the pedestal plate.

14. The processing chamber recited in claim 13, wherein each notch of a plurality of notches extend inward of each pin.

15. The processing chamber recited in claim 13, wherein each notch of the plurality of notches is equidistant from each of the flat edges.

16. The processing chamber recited in claim 10, further comprising:
a header coupled to the pedestal plate.

17. A method of processing a substrate, comprising:
positioning a substrate supported on a blade over a pedestal plate of a pedestal disposed within a processing chamber, the pedestal plate having substantially parallel flat edges disposed between adjacent cut outs of a plurality of cut outs disposed along a perimeter of the pedestal plate, wherein each cut out of the plurality of cut outs is between about 90 degrees and about 125 degrees along the perimeter away from each adjacent cut out of the plurality of cut outs on the perimeter of the pedestal plate, wherein the pedestal plate has recesses disposed in a bottom surface of the pedestal plate;
lifting the substrate from tabs positioned on the blade;
transferring the substrate from the blade to a top surface of the pedestal plate, wherein the tabs are lowered beneath the top surface of the pedestal plate upon transferring the substrate, and wherein blade has substantially parallel forks having a uniform thickness, the uniform thickness extending from the tabs to a base of the blade; and
retracting the blade from the pedestal by passing tabs extending from the blade beneath the recesses.

18. The processing chamber recited in claim 17, further comprising:
removing the blade from the processing chamber, removing the blade further comprises: moving the tabs of the blade through recesses in the pedestal plate.

19. The processing chamber recited in claim 18, further comprising:
removing an arm of the blade through a lower portion of an opening in the processing chamber; and
removing the blade through an upper portion of the opening.

20. The processing chamber recited in claim 17, wherein the tabs pass through notches disposed in the pedestal plate when the tabs are lowered beneath the top surface of the pedestal plate.

* * * * *